(12) United States Patent
Kim

(10) Patent No.: US 10,263,395 B2
(45) Date of Patent: *Apr. 16, 2019

(54) AIRPORT RUNWAY APPROACH LIGHTING APPARATUS

(71) Applicant: Tae Jin Kim, San Jose, CA (US)

(72) Inventor: Tae Jin Kim, San Jose, CA (US)

(73) Assignee: Tae Jin Kim, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/815,530

(22) Filed: Nov. 16, 2017

(65) Prior Publication Data

US 2018/0159303 A1  Jun. 7, 2018

Related U.S. Application Data

(63) Continuation-in-part of application No. 14/804,072, filed on Jul. 20, 2015, now Pat. No. 9,853,413.

(30) Foreign Application Priority Data

Nov. 12, 2014 (KR) .......................... 10-2014-0157298
Nov. 12, 2014 (KR) .......................... 10-2014-0157436

(51) Int. Cl.
*F21V 3/00* (2015.01)
*H01S 5/42* (2006.01)
(Continued)

(52) U.S. Cl.
CPC .............. *H01S 5/423* (2013.01); *F21V 5/043* (2013.01); *F21V 29/503* (2015.01);
(Continued)

(58) Field of Classification Search
CPC ........ F21V 5/043; F21V 29/54; F21V 29/503; F21W 2111/06; F21Y 2105/12;
(Continued)

(56) References Cited

U.S. PATENT DOCUMENTS 9,853,413 B2 * 12/2017 Kim .................... H01S 5/02212
2009/0016391 A1   1/2009 Kalberer
2012/0218742 A1   8/2012 Beukema

FOREIGN PATENT DOCUMENTS

JP       P2002-38426       6/2002
KR       200311952         5/2003
(Continued)

OTHER PUBLICATIONS

Federal Aviation Administration, Office of NextGen, NextGen Implementation Plan, Aug. 2014, 77 pages.
(Continued)

*Primary Examiner* — Ali Alavi
(74) *Attorney, Agent, or Firm* — Innovation Counsel LLP

(57) ABSTRACT

An airport runway approach lighting apparatus is disclosed. According to one embodiment, the airport runway approach light includes a visible light source configured to emit a visible light beam and an infrared light source configured to emit an infrared beam. A first lens is attached to the visible light source to change the visible light beam emitted from the visible light source to a desired visible light beam pattern. The infrared light source includes a plurality of semiconductor laser diodes distributed on a surface of a laser diode chip in an array.

20 Claims, 7 Drawing Sheets

(51) Int. Cl.
*H01S 5/024* (2006.01)
*F21V 29/503* (2015.01)
*F21V 5/04* (2006.01)
*H01S 5/022* (2006.01)
*F21V 29/54* (2015.01)
*F21Y 115/30* (2016.01)
*B64F 1/20* (2006.01)
*F21Y 115/10* (2016.01)
*F21Y 113/13* (2016.01)
*F21W 111/06* (2006.01)
*F21Y 105/12* (2016.01)

(52) U.S. Cl.
CPC ...... *H01S 5/02415* (2013.01); *B64D 2203/00* (2013.01); *B64F 1/20* (2013.01); *F21V 29/54* (2015.01); *F21W 2111/06* (2013.01); *F21Y 2105/12* (2016.08); *F21Y 2113/13* (2016.08); *F21Y 2115/10* (2016.08); *F21Y 2115/30* (2016.08); *H01S 5/02212* (2013.01); *H01S 5/02288* (2013.01)

(58) Field of Classification Search
CPC .............. F21Y 2113/13; F21Y 2115/10; F21Y 2115/30; H01S 5/423; H01S 5/02212; H01S 5/02288; H01S 5/02415
See application file for complete search history.

(56) References Cited

FOREIGN PATENT DOCUMENTS

| | | |
|---|---|---|
| KR | 20060106612 A | 10/2006 |
| KR | 20070114202 A | 11/2007 |
| KR | 10-0827374 B1 | 5/2008 |
| KR | 20080108086 A | 12/2008 |
| KR | 100919843 | 9/2009 |
| KR | 20100064402 A | 6/2010 |
| KR | 101020861 B1 | 3/2011 |
| KR | 10-1268211 B1 | 5/2013 |
| KR | 20140097162 A | 8/2014 |
| KR | 20140114037 A | 9/2014 |
| WO | 2011067108 | 9/2011 |

OTHER PUBLICATIONS

Aeronautical Charting Forum, Charting Group, Meeting Sep. 2-Oct. 28-29, 2009, Recommendation Document, FAA Control # 09-02-218, Incompatibility issues between Enhanced Flight Fision System (EFVS) and Light Emitting Diodes (LEDs), 6 pages.

ETRI Monthly NewsLetter—Dec. 2015 (no English Translation), 10 pages.

* cited by examiner

AIRPORT RUNWAY APPROACH LIGHTING APPARATUS

CROSS REFERENCES

This application is a continuation-in-part of U.S. patent application Ser. No. 14/804,072 filed on Jul. 20, 2015, now U.S. Pat. No. 9,853,413, which claims priority to and the benefit of Korean Patent Application Nos. 10-2014-0157298 and 10-2014-0157436 filed in the Korean Intellectual Property Office on Nov. 12, 2014, the disclosures of which are incorporated herein by reference in their entirety.

FIELD

The present disclosure relates to an approach light used in an airport runway, and more specifically, to an energy saving semiconductor light source used for a runway approach light.

BACKGROUND

An airport runway approach light is used to assist aircrafts in landing on a runway. A typical runway approach light source is a thermal source such as an incandescent bulb and a halogen lamp. The thermal source emits infrared spectral components in addition to components of a visible light spectrum. When the weather condition is favorable and the visibility is good, a pilot during landing uses the components of the visible spectrum with naked eyes while viewing the runway approach lights. However, when the weather condition is unfavorable, or the visibility is bad, a pilot uses an infrared (IR) camera or an enhanced flight vision system (EFVS) equipped in the cockpit to detect infrared rays emitted from the thermal source for safe landing.

The power consumption of a thermal source used for runway approach light is very large (around 100~500 W). Therefore, the thermal source is extremely inefficient because the quantum efficiency to convert energy from an input electrical power to an optical power is very low, and the beam shaping mechanism to convert a generated beam pattern to a required beam pattern is difficult resulting in a high coupling loss.

An inefficient beam shaping mechanism is inherent for a thermal source because the emitted light output from the thermal source is isotropical. As a result, the thermal source needs to use a lens to convert and match an omni-directional output light to a required beam pattern, for example, converting a 360-degree isotropic beam pattern to an approximately 8 degrees at Full Width at Half Maximum (FWHM). Among colors of a visible light spectrum, a green threshold light used for an airport runway approach light requires a green filter, thus its efficiency is even worse.

As a result, a need for an approach light with an energy efficient light emitting diode (LED) light source has been raised recently. However, an energy-efficient LED (e.g., a steady burning white light LED and a threshold green light LED) has, in a practical situation, only a visible spectrum and emits almost no infrared wavelengths. As such, an LED light source is not appropriate as a runway approach light for a next generation airport system because it cannot be safely used during severe or low visibility weather conditions.

To solve this issue, attempts have been made to find an efficient infrared (IR) light source to be used in an airport runway approach light. For example, a graphite foam requires heating the material at about 600 to 800 degrees Celsius to generate an infrared light. However, an athermalization material such as a graphite foam is not reliable and requires a high temperature insulation in a lamp housing.

SUMMARY

An airport runway approach lighting apparatus is disclosed. According to one embodiment, the airport runway approach light includes a visible light source configured to emit a visible light beam and an infrared light source configured to emit an infrared beam. A first lens is attached to the visible light source to change the visible light beam emitted from the visible light source to a desired visible light beam pattern. The infrared light source includes a plurality of semiconductor laser diodes distributed on a surface of a laser diode chip in an array.

The above and other preferred features, including various novel details of implementation and combination of events, will now be more particularly described with reference to the accompanying figures and pointed out in the claims. It will be understood that the particular systems and methods described herein are shown by way of illustration only and not as limitations. As will be understood by those skilled in the art, the principles and features described herein may be employed in various and numerous embodiments without departing from the scope of the present disclosure.

BRIEF DESCRIPTION OF THE DRAWINGS

The accompanying drawings, which are included as part of the present specification, illustrate the presently preferred embodiment and together with the general description given above and the detailed description of the preferred embodiment given below serve to explain and teach the principles described herein.

Figure 1:
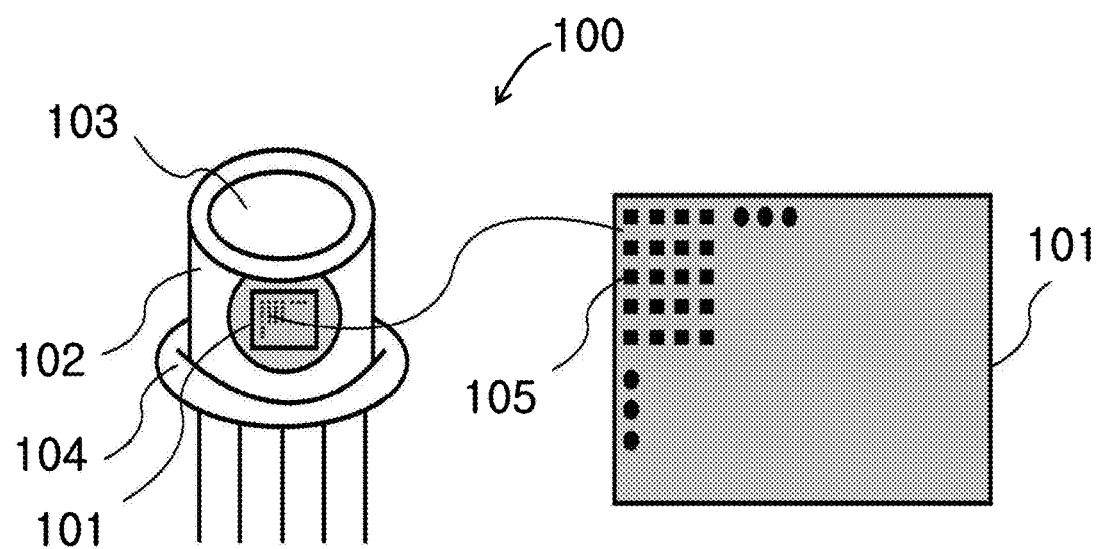
FIG. 1 illustrates an exemplary structure of a vertical cavity surface emitting laser (VCSEL) array-chip disposed in a TO-can package, according to one embodiment.

The figures are not necessarily drawn to scale and elements of similar structures or functions are generally represented by like reference numerals for illustrative purposes throughout the figures. The figures are only intended to facilitate the description of the various embodiments described herein. The figures do not describe every aspect of the teachings disclosed herein and do not limit the scope of the claims.

DETAILED DESCRIPTION

An airport runway approach lighting apparatus is disclosed. According to one embodiment, the airport runway approach light includes a visible light source configured to emit a visible light beam and an infrared light source configured to emit an infrared beam. A first lens is attached to the visible light source to change the visible light beam emitted from the visible light source to a desired visible light beam pattern. The infrared light source includes a plurality of semiconductor laser diodes distributed on a surface of a laser diode chip in an array.

In light of the aforementioned problems of conventional airport runway approach lights, the present disclosure provides an energy-saving airport runway approach light including a semiconductor infrared light source and an LED light source. The energy-saving airport runway approach light satisfies various requirements for an airport approach light system, for example, requirements by the United States Federal Aviation Administration (FAA).

The present airport runway approach light includes an infrared light source including at least one infrared laser diode and an LED light source including a plurality of LEDs. The FAA specification defined in PRD-LED-001 requires approximately 0.5 watts of infrared power within an emission cone of ±8° within a spectral range of 1.3-1.8 µm (or 1.3-2.4 µm) wavelength. The present airport runway approach light meets this infrared power specification by focusing an optical output of the infrared laser to have a small and controlled emission angle and a narrow emission spectrum that is placed within a required spectral window. The present airport runway approach light also meets or exceeds a goal for input power targets to be less than 30 W for both the infrared light source and the LED light source.

According to one embodiment, instead of using a single high power infrared laser diode for the infrared light source, the present airport runway approach light uses an array of lower power laser diodes to better distribute heat generated from the infrared laser diodes. The LEDs that are positioned near the laser diodes are sensitive to heat. The present airport runway approach light better distributes heat generated by the laser diodes and reduces the operating temperature of the neighboring LEDs, thus increases the efficiency and lifetime of the LEDs.

Inherently, laser diodes have a small emission source size and tight beam distribution so they are more readily optically controllable. Conventional laser diodes have a beam distribution of 10~40° and a small source size. A beam output from such laser diodes can be shaped to be within ±8° with s low cost lens.

An infrared laser diode emits a wavelength of 1.55 µm that is in the middle of the FAA-defined spectral window. Infrared laser emitters and detectors used in night vision systems may be made of the same semiconductor material that are used to make such infrared laser diodes. An infrared detector in a night vision system in this wavelength range can easily detect a narrow band infrared laser emission since the wavelength is at the peak of the detector's responsivity. The detector is not sensitive to whether the emission is a narrow band or a broad band and picks up the total power of the infrared signal multiplied by the spectral responsivity at a given wavelength.

A hybrid type light source including an infrared laser diode and LEDs poses various challenges and issues, particularly when it needs to be packaged within a standard lamp holder such as PAR-38 and PAR-56. As discussed above, heat generated from the infrared laser diode needs to be well dissipated, and an electrical power driver that drives the infrared laser diode and LEDs needs to be packaged within a tight space. The existing electrical power supplies and heat sink blocks may be too big to fit into a standard lamp holder.

According to one embodiment, heat generated from the laser diodes and the LEDs is dissipated through a shell of a lamp holder with a heat sink. According to one embodiment, the present airport runway approach light includes an AC direct driver to drive the LEDs. The AC direct driver consumes less power (e.g., 20 watts or less) compared to a DC driver that requires more components, thus costs more. Due to the number of components required, the DC driver requires a larger footprint and more space, making it difficult or inappropriate for being packaged into a standard lamp holder.

According to one embodiment, the present airport runway approach light has an infrared power driver of approximately 10 watts to drive the laser diodes and a cooling system. Examples of such cooling system includes, but are not limited to, a thermoelectric cooling device and a cooling fan. The cooling system may further reduce the operating temperature of the present airport runway approach light.

Environmental conditions may vary depending on the area of operation. For example, ambient temperature is high in Phoenix and low in Anchorage. Ambient temperature could be a factor to consider in determining a specification for an airport runway approach light. In particular, icing over of a lamp could block the visibility and emission of the LEDs and the infrared laser diodes. According to one embodiment, the present airport runway approach light uses a thermally conductive glass as a part of the thermal control system to melt ice or snow on the lamp.

According to one embodiment, the infrared emission from the infrared laser diodes of the present airport runway approach light is compatible with an infrared camera that is used in a commercial thermal camera heads-up display used in an aircraft. The infrared wavelength emitted from the present airport runway approach light generates a response from the detector array of the infrared camera. According to one embodiment, the infrared camera system uses an indium antimonide (InSb or InAsSb) detector array that has a peak responsivity at around 5.25 µm wavelength emission. The peak responsivity may be offset from the infrared laser emission. A detected signal by the infrared detector array may be too bright, temporarily burning pixels in the camera in a similar fashion an optical camera is pointed directly at the sun. In this case, the infrared camera may need to be turned off to discharge the affected pixels and then restarted.

According to one embodiment, the present airport runway approach light may be used in conjunction with various types of detector arrays including an InSb based detector array and an InGaAs based detector array. The InGaAs based detector may have a better efficiency of the detection of the infrared laser while reducing the cost of the camera system.

According to one embodiment, the visible LED light source uses LEDs, and the infrared light source uses one or more infrared semiconductor laser diodes. Arrays of LEDs and the infrared semiconductor laser diodes are assembled together into a lighting lamp fixture. Examples of such lighting map fixture includes, but are not limited to, a PAR-30 lamp holder, a PAR-38 lamp holder, a PAR-56 lamp holder, a BR30 light bulb, a BR40 light bulb, and an A19 light bulb. Beam patterns of an LED array and an infrared semiconductor laser diode array are related to a range and an optical power required for an airport runway approach light. To shape beam patterns of the LED array and the infrared semiconductor laser diode array to desired beam patterns, a beam shaping lens may be used along with the LED array and the infrared semiconductor laser diode array. In particular, the infrared semiconductor laser diode array may not need a lens if the infrared semiconductor laser diode array can produce a desired beam pattern to meet the required performance. According to one embodiment, the semiconductor laser diode has a vertical cavity surface emitting laser (VCSEL) chip. According to another embodiment, a TO-can type package provides the performance and reliability for a low to medium power semiconductor laser diode.

According to one embodiment, the present airport runway approach light consumes less than $\frac{1}{5} \sim \frac{1}{10}$ of the energy consumed by a conventional thermal source lamp. Since the present airport runway approach light includes semiconductor light sources, it is adequate for the next gen airport runway approach lighting system. Moreover, the present airport runway approach light has an expected life span that is at least 10 times longer than that of a conventional thermal source lamp. In addition, the present airport runway approach light has better infrared light beam emission performance and operability than that of conventional thermal sources.

An airport runway approach light is required to emit both visible and infrared spectral components in an optical wavelength range. An optical beam signal in an irradiated region (i.e., an illuminated beam coverage) must be detectable both by an operator at an airport control tower of an airport and by a pilot in the cockpit of an airplane when the airplane approaches a runway. The airport runway approach light must also meet the Medium Intensity Approach Lighting System With Runway Alignment Indicator Lights (MALSR) requirements described in the United States Federal Aviation Administration (FAA) PRD-LED-001. The energy requirements by the FAA must be also satisfied (preferably less than 30 W, less than 45 W is acceptable).

A typical size of light fixtures of existing airport runway approach lights is 4.75 inches in diameter and about 120 mm long (for a PAR-38 lamp holder) or 7 inches in diameter and about 177 mm long (for a PAR-56 lamp holder). In addition to the performance requirements, the present airport runway approach light fits into these existing lamp holders.

Meanwhile, the FAA requires the 1300~2400 nm spectral band infrared be detected by an aerial surveillance infrared camera system. To meet the safety guidelines in regard to human eyes and exposure to a directional laser beam, the present airport runway approach light includes an infrared laser diode light source. The present airport runway approach light satisfies the aforementioned requirements by the FAA by using a visible light beam, an LED, an infrared light beam, an infrared laser diode. Furthermore, one or more lens maybe used to create a beam pattern with desired optical properties.

The present airport runway approach light meets the requirements by replacing existing conventional thermal light sources used in White Steady Burning lamps (e.g., a PAR-38 lamp holder) with a first visible light beam LED light source (e.g., white light LED) and Green Threshold lamps (e.g., a PAR-56 lamp holder) with a second visible light beam LED light source (e.g., green light LED). To provide infrared spectral components that lack in the visible light beam LED light source, the present airport runway approach light includes an infrared semiconductor laser light source (e.g., an infrared laser diode). According to one embodiment, the present airport runway approach light attaches a lens to match a required beam pattern by PRD-LED-001 by the United States Federal Aviation Administration.

To meet the requirements for an infrared emission source required by the FAA such as an optical power condition, a beam pattern, and a limited electrical power consumption, various semiconductor lasers can be used. Examples of semiconductor lasers used as an infrared light source include, but not limited to, a surface emitting semiconductor laser, an edge-emitting semiconductor laser diode, preferably Vertical-Cavity Surface-Emitting Lasers (VCSELs), for example, a VCSEL array-chip made of a material such as InAlGaAs, InGaAs, InAlAs, InGaAsP, GaInAsSb, and InSb on an InP substrate base (semiconductor Group III-V series), and an edge-emitting laser diode with a mid-to-high power laser chip that uses a similar semiconductor material mentioned for VCSELs.

According to one embodiment, the VCSEL array-chip package has a chip structure that meets the beam pattern with a quantum well. According to another embodiment, the VCSEL array-chip package has a chip structure without a lens. According to another embodiment, the VCSEL array-chip package structure may have a transmission type lens. The mid-to-high power edge-emitting semiconductor laser diode may also have a lens-attached structure to match a beam divergence angle and shaped an output beam pattern.

The laser beam directionality of a typical gas laser or a semiconductor laser with a collimation lens is good, and the optical beam power density (i.e., a beam power per unit area) in the far distance is high, so it can be dangerous to human eyes if it shines directly. However, the optical beam power density for an edge-emitting laser diode with a lens or a light source of a surface emission type for the beam shaping of about 10 degrees of FWHM is greatly reduced when the beam is going to spread at a predetermined distance compared to a directionally collimated beam. For example, when the general power density of a laser is 1 mW/cm$^2$, and a beam divergence of Half Width at Half Maximum (HWHM) about 10 degrees, the area of the beam at 100 m becomes about 1.000 m$^2$. In this case, the power density of 1 mW/cm$^2$ laser becomes $\frac{1}{10}^7$. Its power density falls sharply lower than an eye-safety level.

In a more practical environment where a narrow beam divergence angle with a shorter distance is required by the FAA, both the edge-emitting laser diode and the surface emitting VCSEL have similar beam divergence angles. For example, when the laser power has a HWHM beam divergence angle of +/−8°, a laser optical beam power of 1 W, and the beam propagation distance of about 4 m, the area at a distance of 4 m is about 10,000 cm$^2$. As a result, the power density of the laser reduces to a low level of around 0.1 mW/cm$^2$.

This power density quantity of 0.1 mW/cm² is 10 times lower than that of the Maximum Permissible Exposure (MPE) that is the maximum allowable amount of exposure defined by a sight-saving condition of about mW at 1550 nm. In addition, the area of a human eye that the light comes in is usually 0.39 cm². As a result, the optical power coming into the retina of the human eye is 39% of the MPE value (0.1 mW/cm²). As a result, the actual optical power density decreases towards workers or pilots at the airport to a safe level. Moreover, airport lighting fixtures (or lighting apparatus) installers and maintenance workers are required to wear protective glasses, and be highly trained and licensed to assure the safety of the airport workers.

The VCSEL array-chip according to the present disclosure has a high quantum efficiency with a correspondingly appropriate optical power. In particular, the VCSEL array-chip has particularly a good beam divergence angle with a circular symmetric pattern and a typical beam divergence of 10 degrees at FWHM, and meets or exceeds a beam pattern requirement by the FAA. The VCSEL beam emitted by the VCSEL array-chip needs to be sensed by an infrared camera of an airplane.

The beam pattern required for an airport control tower and pilots may be different from a beam pattern coming out of a typical VCSEL. According to one embodiment, the beam pattern (e.g., 10 degrees of FWHM) generated by the VCSEL array-chip is shaped to a desired beam pattern (e.g., 8 degrees of FWHM) using a beam shaping lens. For example, the beam shaping lens may shape an asymmetric non-circular beam pattern to a circular symmetric beam pattern. According to another embodiment, the VCSEL array-chip may be used without shaping the beam pattern using a beam shaping lens. In this case, the VCSEL array-chip with a wider divergence angle (e.g., 10 degrees of FWHM) may employ a higher optical power to meet a required power density condition (e.g., 8 degrees of FWHM).

However, the output beam of an edge-emitting laser diode has a horizontal direction divergence of 8 to 15 degrees and a vertical direction divergence of about 25 to 45 degrees. When the beam divergence angle required for both the horizontal and the vertical direction is about 8 degrees varying with the airport conditions, the present airport runway approach light uses a cylindrical refractive lens attached to the front of the side-emitting laser diode chip to shape the asymmetric beam to a symmetric beam with 8 degrees of FWHM. The shaped beam with the cylindrical refractive lens may not be a perfect circular symmetric but is acceptable to cover substantially equally in horizontal and vertical directions and to be detected by an infrared camera in an airplane.

Either VCSEL array-chip light source or edge-emitting semiconductor laser light source is superior to existing thermal light sources in terms of reliability, a life span, power consumption, and the size. The present airport runway approach light packages these solid state semiconductor laser light source and a visible LED light source (e.g., a white light LED, a green light LED) into a lamp holder fixture (e.g., PAR-38 and PAR-56) with a power supply. The present airport runway approach light generates an infrared wavelength band required by the FAA, and a desired beam pattern while reducing the power consumption and size.

The FAA requires a beam divergence of an infrared beam to be about 8 degrees, and a beam divergence of a visible light LED beam to be circular symmetric with an angle of about +/−4~8 degrees. The beam from an LED package typically has a FWHM 120 degree Lambertian pattern but can be shaped to a beam pattern to 4~10 degrees at a FWHM by using a commercially available lens (e.g., a narrow beam angle lens from Any Casting Co., Ltd. from Korea and LED Link Corporation from Taiwan).

According to one embodiment, the present airport runway approach light can measure a distance to an aircraft using the infrared semiconductor laser diode in various weather conditions. The speed of the infrared light signal is denoted as $v\_IR=c/n$, where c is the speed of light in a vacuum, and n is the index of refraction in the space media. For a given weather condition, the index of refraction may vary between 1 (index of refraction in a vacuum) and 1.33 (index of refraction of water). In one embodiment, the distance measurement can be achieved by sending a series of predetermined modulated signal packets. For example, the present airport runway approach light sends a patterned infrared signal (e.g., a signal pattern of "1101," where 1 is on and 0 is off for a short period of time, for example, 1 microsecond) for a duration of $\Delta t1$ and a subsequent patterned infrared signal (e.g., a signal pattern of "1001") for a duration of $\Delta t2$ separated by a predetermined time interval $\Delta tt$. A noise signal can be filtered by using the predetermined patterns and duration of the infrared signals. The measured time interval $\Delta ttm$ at the aircraft between the received patterned infrared signals may be deviated from the predetermined time interval $\Delta tt$ due to the distance from the present airport runway approach light to the aircraft, and the travel time of the infrared signal can be determined to be ($\Delta ttm - \Delta tt$). The distance H from the runway or landing place (with respect to the present airport runway approach light) to the aircraft can be determined by $H = v\_IR \times (\Delta ttm - \Delta tt)$. The distance information for the aircraft is an important factor for safe landing in severe weather conditions. The distance information for the aircraft obtained at the aircraft may be send back to the control tower.

According to one embodiment, the present airport runway approach light meets a required beam pattern by using an infrared semiconductor laser diode either in the form of an edge-emitting laser diode or a VCSEL array-chip package. The infrared semiconductor laser diode may be used with or without an optical lens for specific cases. The present airport runway approach light including an array-chip including of infrared semiconductor laser diodes and its package structure will be explained below with reference to the drawings.

FIG. 1 illustrates an exemplary structure of a vertical cavity surface emitting laser (VCSEL) array-chip disposed in a TO-can package, according to one embodiment. The VCSEL array-chip package 100 includes a VCSEL array-chip 101 including VCSEL diode 105. The VCSEL array-chip 101 is contained in a TO-can package 102 with a stem 104 and a glass window 103. The VCSEL array-chip 101 may be packaged in various package types (e.g., TO56~TO9).

Figure 2:
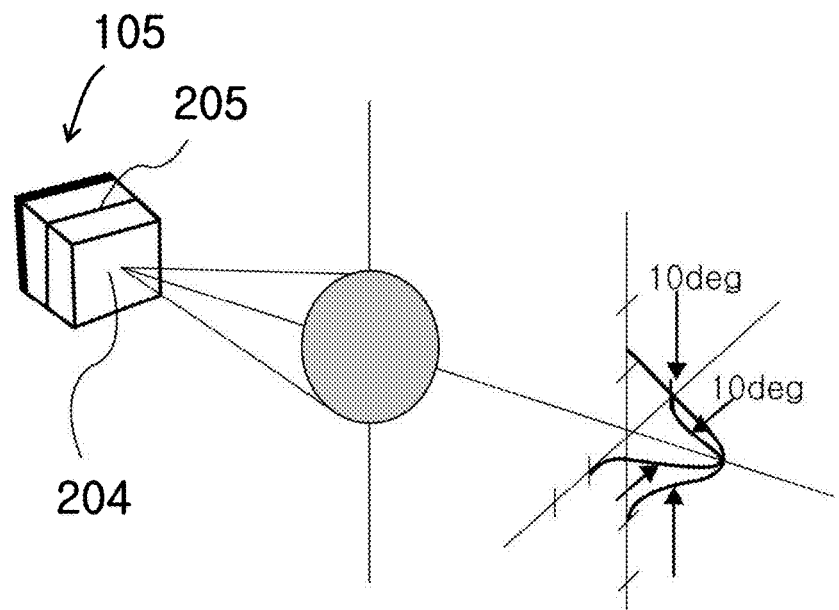
FIG. 2 illustrates a beam divergence pattern of an exemplary VCSEL diode, according to one embodiment.

FIG. 2 illustrates a beam divergence pattern of an exemplary VCSEL diode, according to one embodiment. The VCSEL diodes 105 emits a beam having a circular and symmetric beam divergence pattern with about 10 degrees of FWHM from an active area of a junction 205 through a top surface 204.

Figure 3:
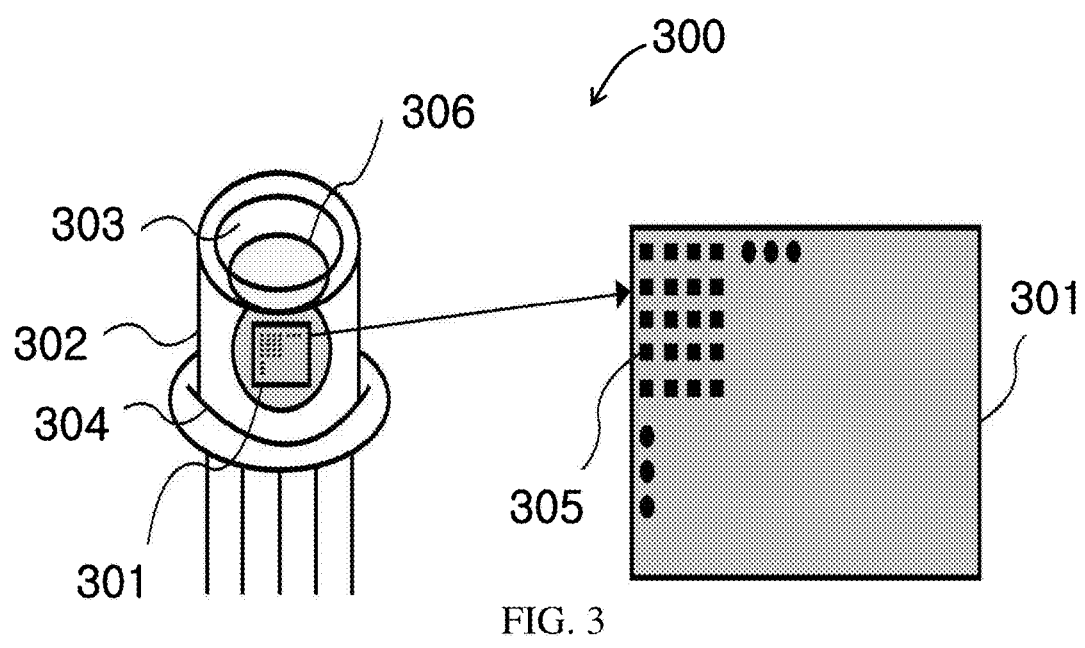
FIG. 3 illustrates an exemplary structure of a lens-fitted VCSEL array-chip disposed in a TO-can package, according to one embodiment.
Figure 4:
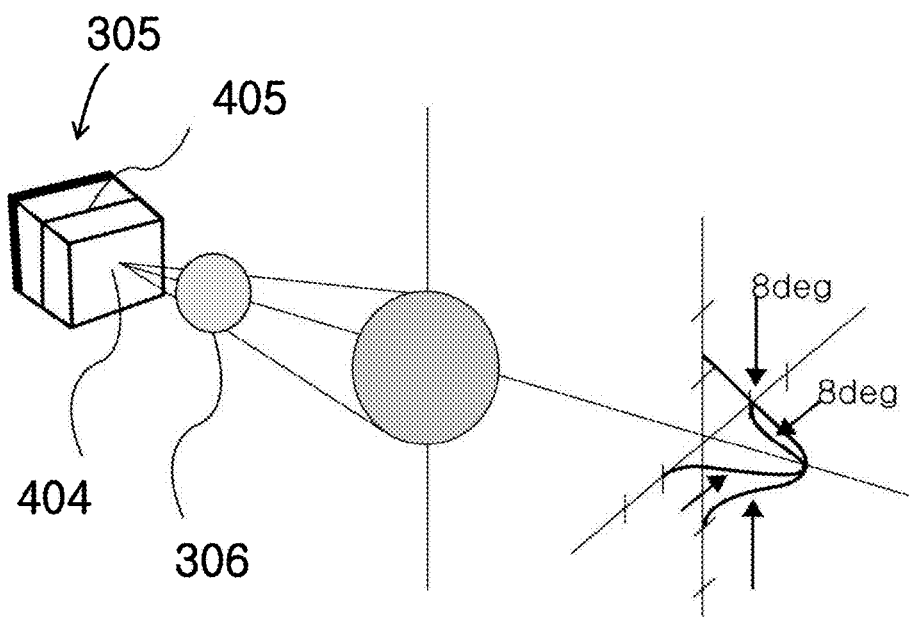
FIG. 4 illustrates a beam divergence pattern of an exemplary VCSEL diode with a beam shaping lens, according to one embodiment.

FIG. 3 illustrates an exemplary structure of a lens-fitted VCSEL array-chip disposed in a TO-can package, according to one embodiment. FIG. 4 illustrates a beam divergence pattern of the exemplary VCSEL diode of FIG. 3 including a beam shaping lens, according to one embodiment. The lens-fitted VCSEL array-chip package 300 includes a VCSEL array-chip 301, and the VCSEL array-chip 301 includes a plurality of VCSEL diodes. The VCSEL array-chip 301 is contained in a TO-can package 302 with a stem 304, a lens 306, and a glass window 303.

The lens 306 is attached on the top of the VCSEL array-chip 301. Although it is not shown, the lens 306 may be attached outside of the TO-can package 302 to emit a desired beam pattern. The glass window 303 protects the VCSEL array-chip 301 and transmits most of the infrared light at an upper part of the lens-fitted VCSEL array-chip package 300. The stem 304 for the VCSEL array-chip 301 is attached to a bottom part of the lens-fitted VCSEL array-chip package 300. The upper part of the window is a part of the TO-can-type package 302, and the lens 306 can be attached either inside or outside of the TO-can package 302 depending on the design and/or application. According to one embodiment, the VCSEL array-chip 301 adapted with a beam shaping lens 306 emits a circular symmetric beam pattern of a divergence beam angle of +/−8 degrees FWHM.

The VCSEL diodes 305 emits a beam having a circular and symmetric beam divergence pattern with about 10 degrees of FWHM from an active area of a junction 405 through a top surface 404. The design of the beam shaping lens 306 of the lens-fitted VCSEL array-chip package 300 is simpler compared to an edge-emitting laser diode of FIG. 7. It is because the lens-fitted VCSEL array-chip package 300 needs a shaping of a beam divergence angle, for example, from circular symmetric 10 degrees of FWHM to a circular symmetric of 4~8 degrees, whereas the edge-emitting laser diode may need a lens that shapes both a beam divergence angle and a beam pattern shape.

Referring to FIG. 3, the VCSEL array-chip 301 has a VCSEL array structure including VCSEL diode 305 as a unit cell repeated both in x and y directions. The VCSEL array structure forms a proper rectangle array having a size and meeting the required infrared beam power and pattern at a given driving current. According to one embodiment, the VCSEL array-chip 301 has an array size that ranges from 5×5 to 30×30 in a square array. The size of the array may be determined by the required optical beam power and operating conditions. According to one embodiment, the array is manufactured as an array-chip 301 with an array structure using an array mask in VLSI chip processing, and the array-chip may be assembled inside a TO-can type 302 fixture to form a VCSEL array-chip package.

According to one embodiment, a single chip size is about 5~50 µm, and a periodical space between chips is about 5~250 µm. In one example, the chip area is from 30 µm×30 um to 1300 µm×1300 µm for a VCSEL array size of 5×5. In another example, the chip area is from 155 µm×155 µm to 7550 µm×7550 µm for s VCSEL array size of 30×30. In yet another example, an array-chip size is about 1,000 µm×1,000 µm~2,000 µm×2,000 µm. The chip area, the array-chip size may vary depending on the required optical power and the given operating current.

Figure 5:
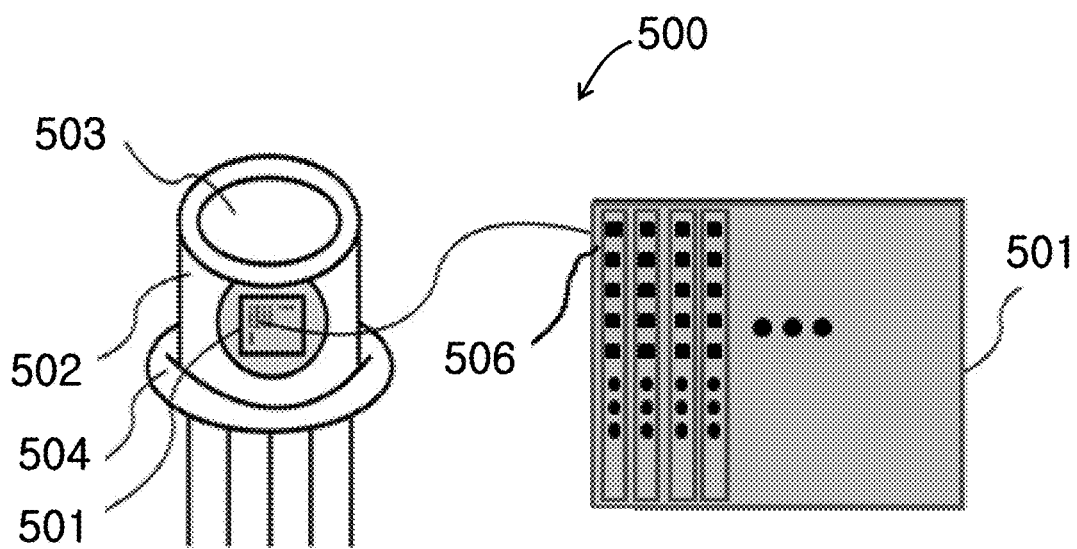
FIG. 5 illustrates an exemplary linear array structure of VCSEL disposed in a TO-can type package, according to one embodiment.

According to one embodiment, an array-chip (e.g., the VCSEL array-chip 301) may not be a square array. For example, the array-chip is a 9×11 rectangular array. The array-chip can be of a different size and shape to meet a desired optical beam power requirement and generates a desired beam pattern. FIG. 5 illustrates an exemplary linear array structure of VCSEL disposed in a TO-can type package, according to one embodiment. Each of the VCSEL arrays 506 is a linear array (1×n), and a total of n linear VCSEL arrays form an n×n array 501. A specific chip and array size may be determined to emit a desired infrared beam pattern and optical beam power.

Figure 6:
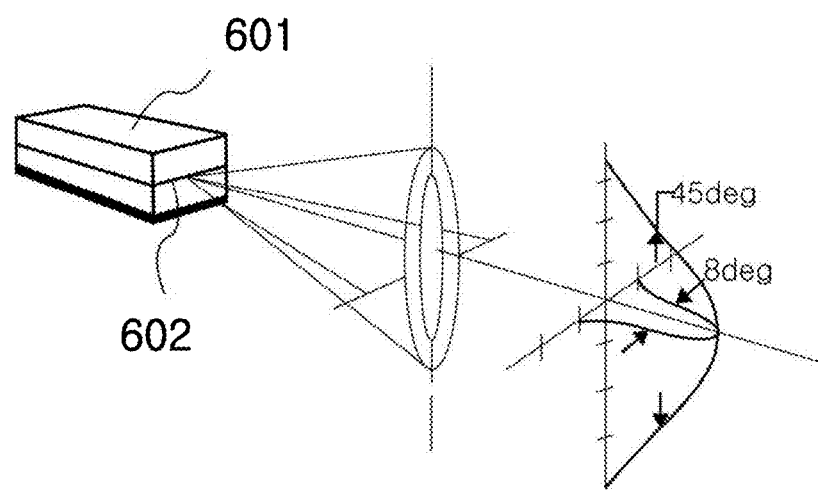
FIG. 6 illustrates a beam divergence pattern for an exemplary edge-emitting type semiconductor laser, according to one embodiment.

FIG. 6 illustrates a beam divergence pattern for an exemplary edge-emitting type semiconductor laser, according to one embodiment. The edge-emitting type semiconductor laser 601 has a junction (active area) 602. The beam emitted from the junction (active area) 602 of the edge-emitting semiconductor laser 601 has a beam pattern where a horizontal direction beam pattern mostly shows the full width at half maximum of about 8~15 degrees and a vertical direction beam pattern shows mostly the full width at half maximum of about 25~45 degree exit angles. There may be some variations depending on the structure and size of the edge-emitting semiconductor laser 601 and the active area 602.

Figure 7:
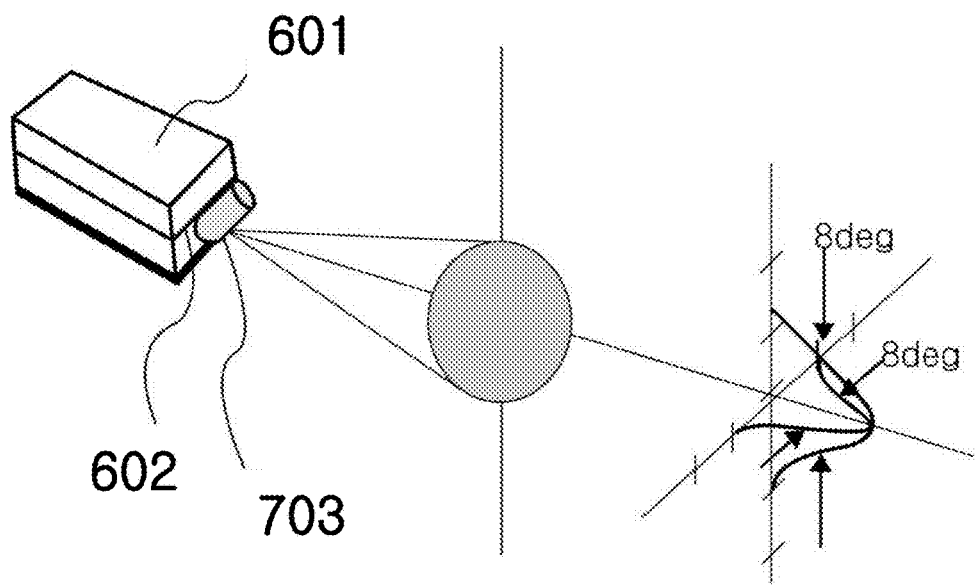
FIG. 7 illustrates a beam divergence of an exemplary edge-emitting semiconductor laser used with a cylindrical lens, according to one embodiment.

FIG. 7 illustrates a beam divergence of an exemplary edge-emitting semiconductor laser used with a cylindrical lens, according to one embodiment. A circular symmetry beam pattern is required for an airport approach indicator light, and the beam shaping of a beam pattern emitted from the junction 602 of the edge-emitting semiconductor laser diode 601 is realized using the cylindrical lens 703. The shaped beam pattern meets both the horizontal and vertical direction beam pattern to be +/−8 degrees of FWHM.

Figure 8:
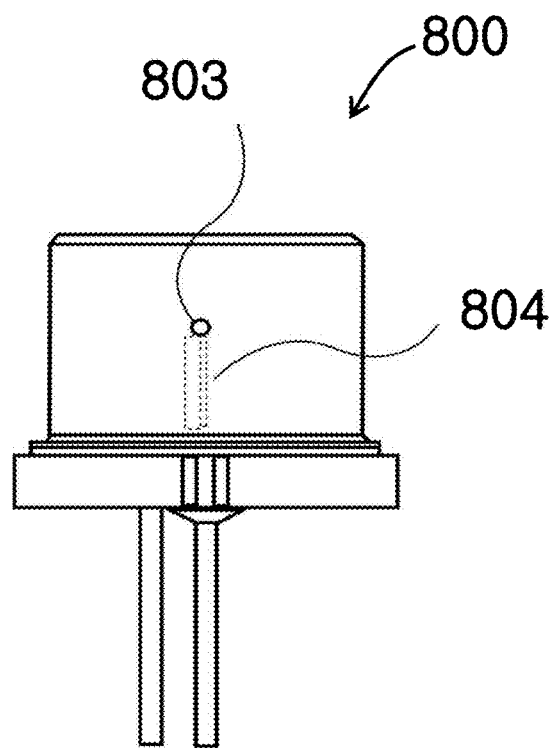
FIG. 8 illustrates an exemplary structure of an edge-emitting type semiconductor laser chip with an attached lens inside a TO-can type package, according to one embodiment.

FIG. 8 illustrates an exemplary structure of an edge-emitting type semiconductor laser chip with an attached lens inside a TO-can type package, according to one embodiment. The TO-can type package 800 includes a cylindrical lens 803 and an edge-emitting semiconductor laser diode (e.g., the edge-emitting semiconductor laser diode 701 of FIG. 7) that is attached to a sub-mount surface 804. The cylindrical lens 803 is attached to the edge-emitting semiconductor laser diode.

A VCSEL array-chip package maybe used with a thermoelectric cooler (TEC) for the cooling to cool the package and maintain the optical power. However, a TEC without a TEC may be used if the naturally cooled VCSEL array or edge-emitting laser diode package can generate enough optical power to meet the performance requirement and maintain a desired optical power level in an operating environment for the airport runway approach light.

According to one embodiment, the present airport runway approach light is a hybrid type module including an infrared semiconductor VCSEL array-chip and a visible LED packaged onto the same metal printed circuit board (PCB), connected to the same heat sink, and fitted in a lamp fixture either in a PAR-38 type lamp holder or a PAR-56 type lamp holder. The VCSEL array-chip package may be separately disposed onto an adaptable heat sink. Either a screw or a clamp can be used to tighten the adaptive heat sink to the same metal PCB or the same FR4 PCB using a thermal grease or a thermal pad.

According to one embodiment, an infrared light source (e.g., an edge-emitting semiconductor laser diode package or a VCSEL array-chip package) is placed for the airport runway approach light. In view of the infrared light output requirement, preferably an optical power output (about 0.5 W) and a desired beam pattern, LED packages can be disposed on a metal PCB directly, and a semiconductor laser diode TO-can type package can be deployed onto a dielectric FR4 PCB. Those PCBs can be mounted to a heat sink of PAR-38 or PAR-56 fixtures using a Thermal Interface Material (TIM) application to the interface surfaces. If the infrared light source needs an extra capacity of heat sink, an extra heat sink can be added as an adaptive piece (not shown).

Figure 9A:
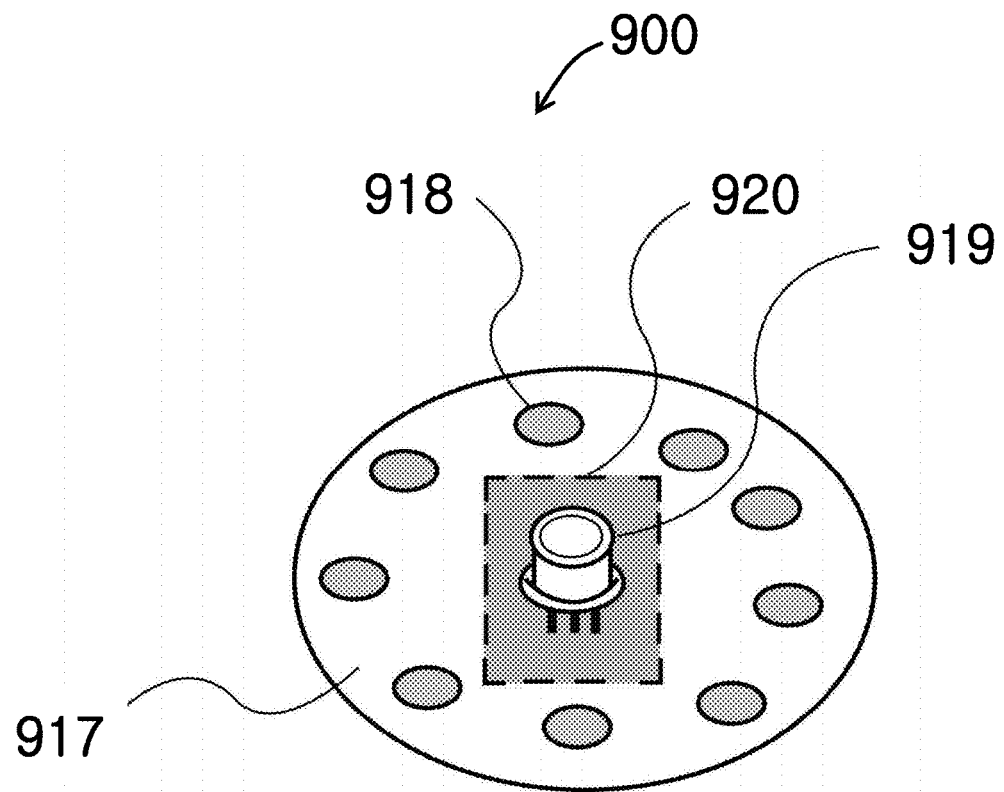
FIG. 9A illustrates a lamp structure of an exemplary airport runway approach light, according to a first embodiment.
Figure 9B:
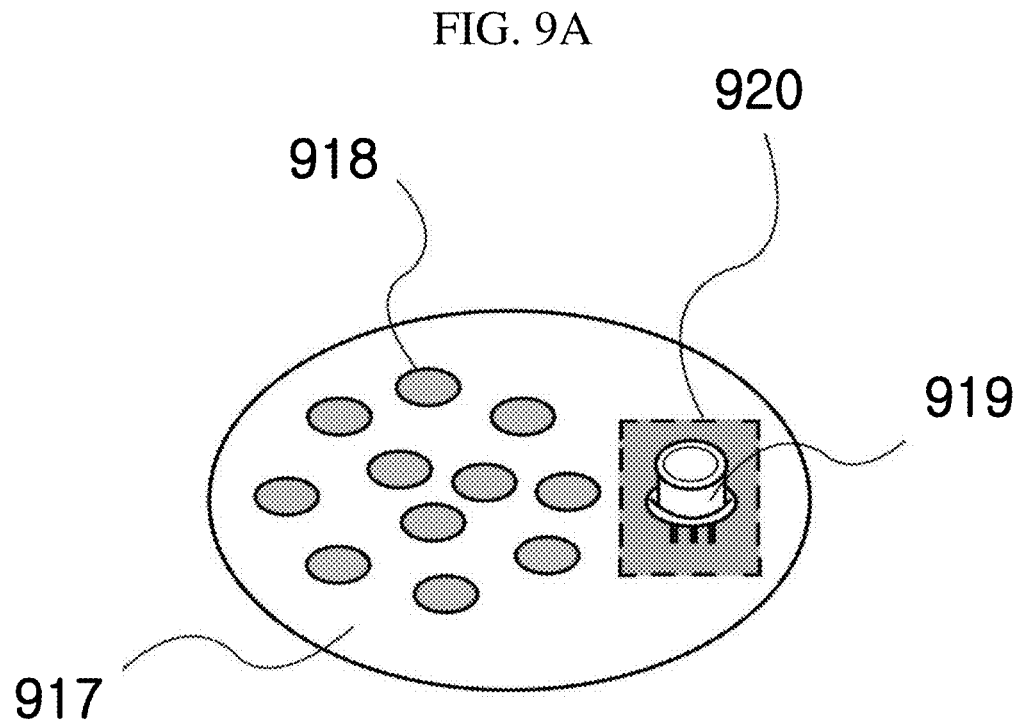
FIG. 9B illustrates a lamp structure of an exemplary airport runway approach light, according to a second embodiment.
Figure 9C:
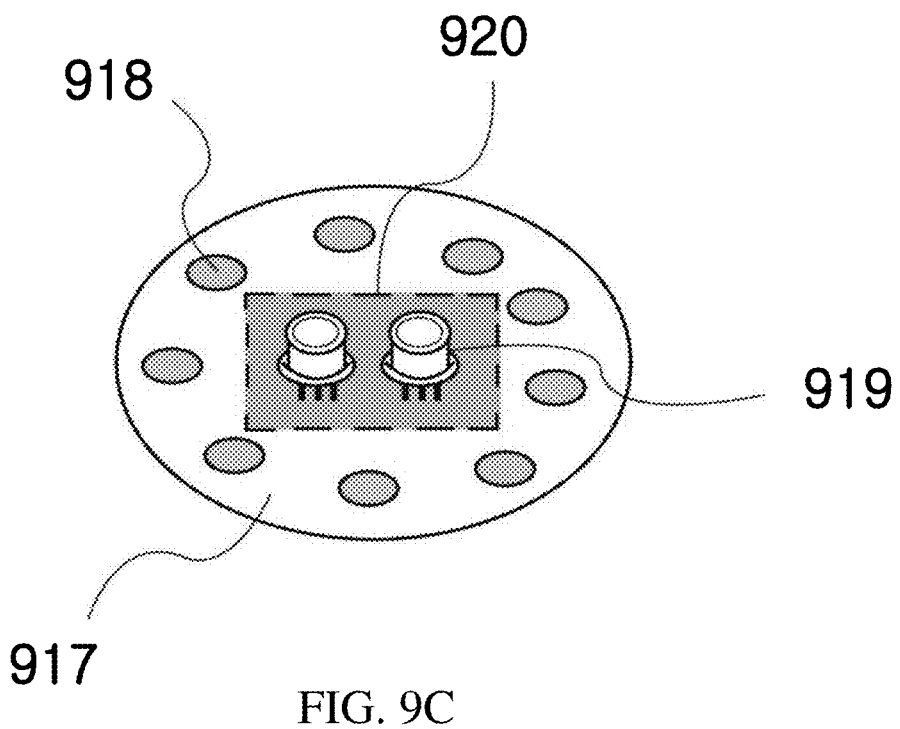
FIG. 9C illustrates a lamp structure of an exemplary airport runway approach light, according to a third embodiment.
Figure 9D:
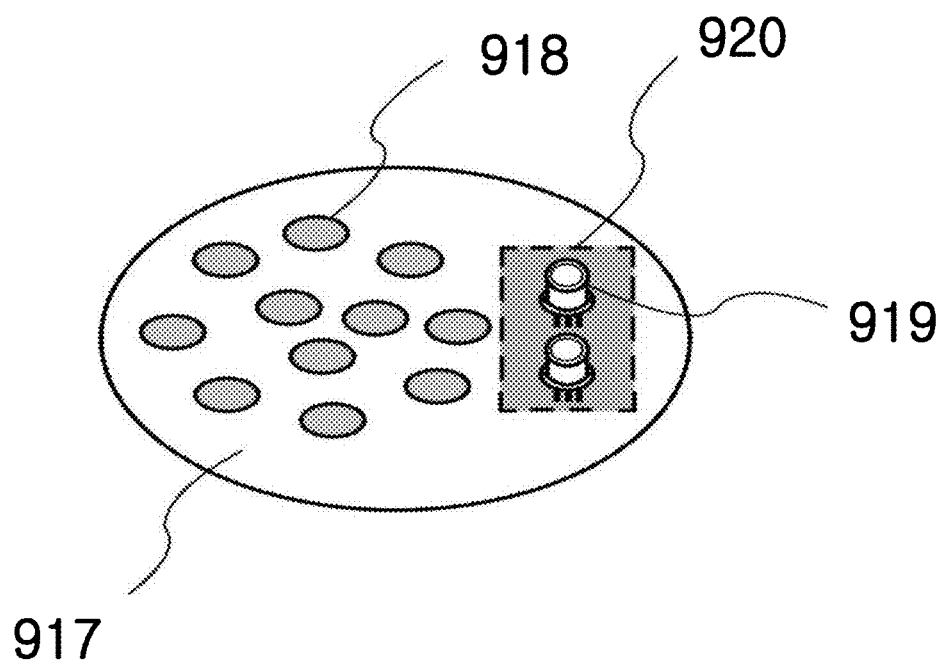
FIG. 9D illustrates a lamp structure of an exemplary airport runway approach light, according to a fourth embodiment.
Figure 9E:
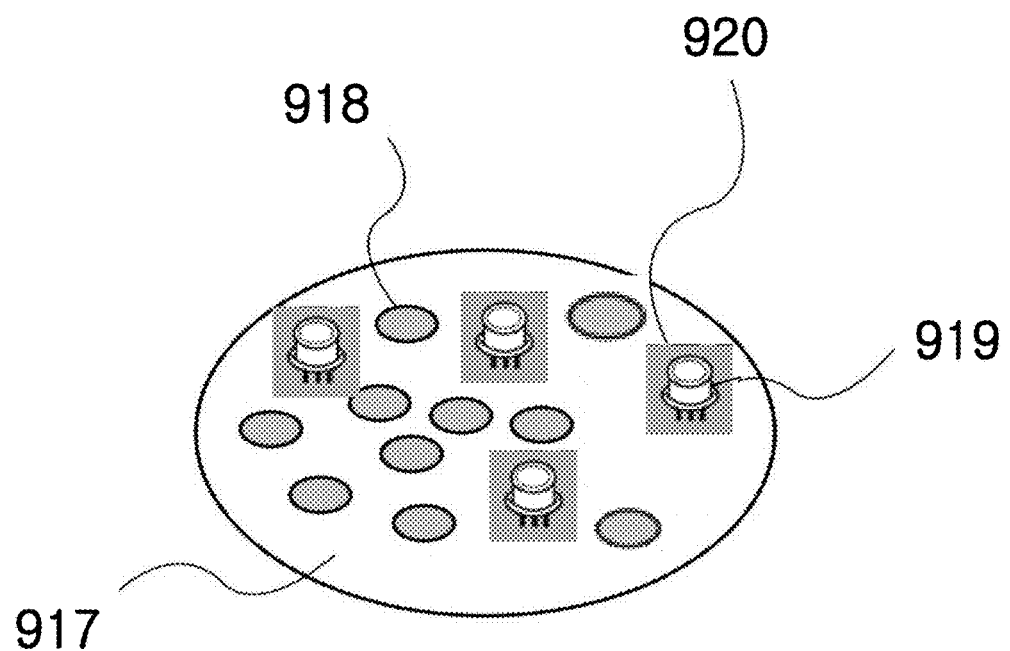
FIG. 9E illustrates a lamp structure of an exemplary airport runway approach light, according to a fifth embodiment.

FIGS. 9A-9E illustrate various embodiments of an exemplary lamp structure of an airport runway approach light. FIG. 9A shows a plurality of visible LEDs 918 disposed in a circular ring shape, and the infrared laser diode package 919 on the FR4 PCB 920 that is disposed at the center of the metal PCB 917. FIG. 9B shows a plurality of visible LEDs 918 disposed on one side of the metal PCB and the infrared laser diode package 919 disposed on the FR4 PCB 920 on the other side. FIG. 9C shows two infrared semiconductor light source groups 920 disposed on FR4 PCB 920 at the center. FIG. 9D shows two infrared semiconductor light source groups 920 disposed on the side. FIG. 9E shows four infrared laser diode packages 919 and a plurality of visible LEDs 918 disposed over the FR4 PCB 920. Although some of these embodiments show a group size of two packages, it is understood that any number of packages may be grouped together without deviating from the scope of the present disclosure.

Additionally, the present disclosure is not limited to the above-described embodiments. Instead, it is understood that the present disclosure can be realized in various embodiments without departing from the scope of the present disclosure. For example, it is equally applicable to the edge-emitting laser diode that all the methods for VCSEL array-chip package described in the above from a TO-can type to a fastening method using screws or clamps.

I claim:

1. An airport runway approach light comprising:
a visible light source including a light emitting diode (LED) configured to emit a visible light beam;
a first lens attached to the visible light source and configured to change the visible light beam emitted from the visible light source to a desired visible light beam pattern; and
an infrared light source configured to emit an infrared beam,
wherein the infrared light source includes: 1) a plurality of semiconductor laser diodes that are distributed on a surface of a laser diode chip in an array, or 2) an edge-emitting laser diode.

2. The airport runway approach light of claim 1, further comprising a second lens attached to the infrared light source and configured to change the infrared beam emitted from the infrared light source to a desired infrared beam pattern.

3. The airport runway approach light of claim 1, wherein the infrared light source is included in a vertical cavity surface emitting laser (VCSEL) array-chip package.

4. The airport runway approach light of claim 3, wherein the VCSEL array-chip is 5-by-5 to 30-by-30 array having a rectangle shape.

5. The airport runway approach light of claim 3, wherein a single VCSEL chip of the VCSEL array-chip has a size within 5~50 µm, and a periodic space between VCSEL chips is within 5~250 µm.

6. The airport runway approach light of claim 3, wherein the VCSEL array-chip includes a plurality of linear VCSEL array-chips that is mounted on a rectangular sub-mount and form a rectangular infrared source.

7. The airport runway approach light of claim 2, wherein the second lens attached to the edge-emitting laser diode is a cylindrical lens.

8. The airport runway approach light of claim 1, wherein the visible light source includes a white LED, and the airport runway approach light is contained in a PAR-38 lamp holder.

9. The airport runway approach light of claim 1, wherein the visible light source includes a green LED, and the airport runway approach light is contained in a PAR-56 lamp holder.

10. The airport runway approach light of claim 1, wherein the infrared light source emits an infrared light having a wavelength of 1300~2400 nm.

11. The airport runway approach light of claim 1, further comprising a power supply configured to drive the visible light source and the infrared light source.

12. The airport runway approach light of claim 1, wherein the desired infrared beam pattern has 8 degrees of Full Width at Half Maximum (FWHM).

13. The airport runway approach light of claim 1, wherein the infrared light source is contained in a TO-can type package including a heat sink stem and a glass window.

14. The airport runway approach light of claim 13, wherein the infrared light source is cooled with a thermo-electric cooler.

15. The airport runway approach light of claim 13, further comprising a second lens attached to the infrared light source and configured to change the infrared beam emitted from the infrared light source to a desired infrared beam pattern,
wherein the second lens is disposed on the infrared light source in an upper window direction of an inside of the TO-can type package.

16. The airport runway approach light of claim 1, wherein the visible light source and the infrared light source are mounted on a same printed circuit board (PCB) and connected to a same heat sink disposed in a same lamp fixture.

17. The airport runway approach light of claim 1, further comprising an adaptable heat sink for the infrared light source, wherein the infrared light source is attached to the adaptable heat sink using a thermal grease or a thermal pad.

18. The airport runway approach light of claim 1, wherein the infrared light source comprises a plurality of infrared laser diode packages, and wherein at least one of the plurality of infrared laser diode packages is disposed in a center of a PCB and the visible light source is disposed in a circumference of the PCB.

19. The airport runway approach light of claim 1, wherein the infrared light source comprises a plurality of infrared laser diode packages, and wherein at least one of the plurality of infrared laser diode packages is disposed on a first side of a PCB, and wherein the visible light source is disposed on a second side of the PCB.

20. The airport runway approach light of claim 1, wherein the infrared light source sends a series of patterned signals separated by a predetermined time interval, and a distance from the infrared light source to an aircraft is determined by measuring a difference between the predetermined time interval and a measured time interval between the series of patterned signals received at the aircraft.

* * * * *